(12) United States Patent
Dib et al.

(10) Patent No.: US 10,855,195 B2
(45) Date of Patent: Dec. 1, 2020

(54) MODULAR SYSTEM FOR CONVERTING A DC ELECTRICAL POWER INTO THREE-PHASE ELECTRICAL POWER AND METHOD THE SAME

(71) Applicants: IFP Energies nouvelles, Rueil-Malmaison (FR); MAVEL S.r.l., Pont Saint Martin (IT)

(72) Inventors: Wissam Dib, Suresnes (FR); Denny Chiono, Saint Nicolas (IT); Davide Bettoni, Settimo Vittone To Italy (IT)

(73) Assignees: IFP ENERGIES NOUVELLES, Rueil-Malmaison (FR); MAVEL S.R.L., Pont Saint Martin (IT)

(*) Notice: Subject to any disclaimer, the term of this patent is extended or adjusted under 35 U.S.C. 154(b) by 280 days.

(21) Appl. No.: 15/777,729

(22) PCT Filed: Oct. 26, 2016

(86) PCT No.: PCT/EP2016/075790
§ 371 (c)(1),
(2) Date: May 21, 2018

(87) PCT Pub. No.: WO2017/089062
PCT Pub. Date: Jun. 1, 2017

(65) Prior Publication Data
US 2018/0351472 A1    Dec. 6, 2018

(30) Foreign Application Priority Data
Nov. 23, 2015  (FR) .................................. 15 61213

(51) Int. Cl.
*H05K 1/18*    (2006.01)
*H02M 7/00*    (2006.01)
(Continued)

(52) U.S. Cl.
CPC ............ *H02M 7/003* (2013.01); *H02K 11/33* (2016.01); *H02M 1/34* (2013.01); *H05K 1/09* (2013.01);
(Continued)

(58) Field of Classification Search
CPC .......... H02M 7/00; H02M 7/003; H02M 7/23; H02M 7/14807; H02M 1/34; H05K 1/09;
(Continued)

(56) References Cited

U.S. PATENT DOCUMENTS

| | | | |
|---|---|---|---|
| 4,992,925 A * | 2/1991 | Meyer ................... | H02M 7/003 363/141 |
| 5,132,896 A * | 7/1992 | Nishizawa ............ | H02M 7/003 363/144 |

(Continued)

FOREIGN PATENT DOCUMENTS

| DE | 102013021487 A1 | 8/2014 |
|---|---|---|
| WO | 2011016854 A1 | 2/2011 |

OTHER PUBLICATIONS

International Search Report for PCT/EP2016/075790, dated Feb. 6, 2017; English translation submitted herewith (7 pgs.).

*Primary Examiner* — Tuan T Dinh
(74) *Attorney, Agent, or Firm* — Fitch, Even, Tabin & Flannery LLP

(57) ABSTRACT

The present invention is a system for converting a direct electrical power into alternating electrical power. The conversion system comprises an assembly on a printed circuit board (14) of power modules (7), an electrical energy recovery module (5') and a coil and the present invention also relates to a method for assembling the conversion system, and a motor system comprising the conversion system.

12 Claims, 4 Drawing Sheets

(51) Int. Cl.
  *H02M 1/34* (2007.01)
  *H02K 11/33* (2016.01)
  *H05K 1/09* (2006.01)
  *H05K 3/30* (2006.01)
  *H05K 7/20* (2006.01)
  *H02M 1/00* (2006.01)

(52) U.S. Cl.
  CPC ............ *H05K 1/181* (2013.01); *H05K 3/303* (2013.01); *H05K 7/20927* (2013.01); *H02M 2001/0058* (2013.01); *H02M 2001/342* (2013.01); *H05K 2201/064* (2013.01); *H05K 2201/1003* (2013.01); *H05K 2201/10015* (2013.01); *H05K 2201/10151* (2013.01); *H05K 2201/10166* (2013.01); *H05K 2201/10545* (2013.01)

(58) Field of Classification Search
  CPC ........ H05K 7/20; H05K 7/20908; H05K 3/30; H05K 1/11; H05K 1/18; H05K 1/181–187; H01L 23/3114

USPC .................................. 361/781–784, 775–777
  See application file for complete search history.

(56) References Cited

U.S. PATENT DOCUMENTS

| | | | |
|---|---|---|---|
| 10,033,290 B2* | 7/2018 | Koyano | H02M 5/293 |
| 2004/0223301 A1* | 11/2004 | Muller | H05K 7/20909 |
| | | | 361/699 |
| 2006/0086981 A1* | 4/2006 | Yamaguchi | H02M 7/003 |
| | | | 257/347 |
| 2006/0268585 A1 | 11/2006 | Domb et al. | |
| 2012/0063184 A1* | 3/2012 | Mazumder | H02M 7/4807 |
| | | | 363/98 |
| 2012/0147641 A1* | 6/2012 | Yamaguchi | H02M 1/34 |
| | | | 363/132 |
| 2013/0027874 A1 | 1/2013 | Peng et al. | |
| 2015/0311815 A1 | 10/2015 | Nedic et al. | |
| 2016/0344279 A1* | 11/2016 | Kanda | H02H 7/1225 |
| 2017/0302199 A1* | 10/2017 | Boulharts | H02M 7/23 |

\* cited by examiner

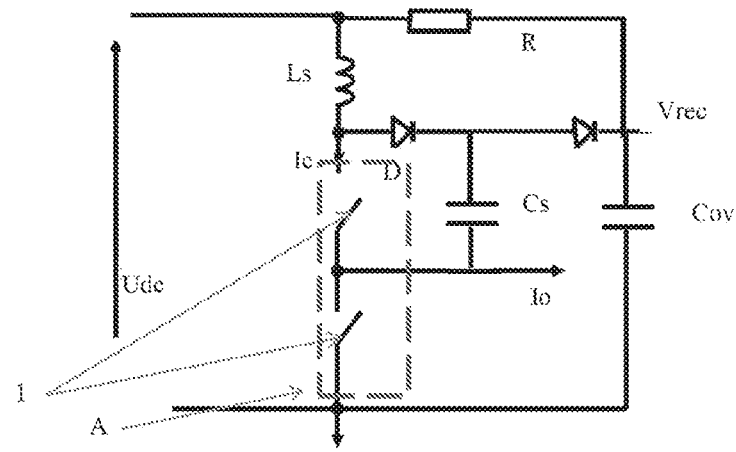
Figure 3
(Prior Art)
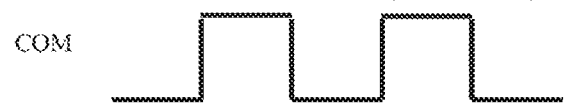
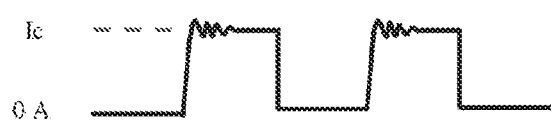
Figure 4
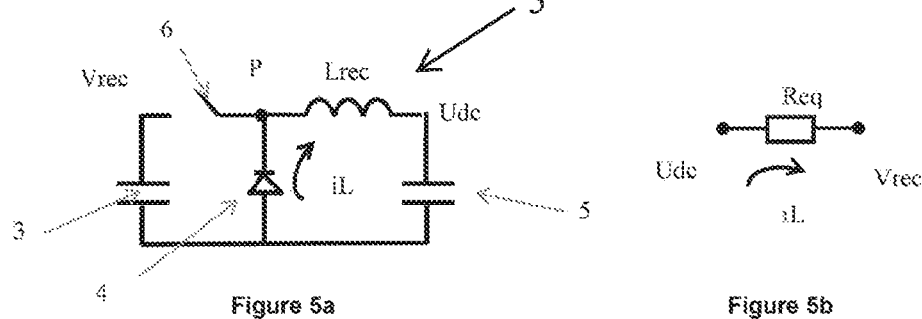
Figure 5a　　　　　Figure 5b

MODULAR SYSTEM FOR CONVERTING A DC ELECTRICAL POWER INTO THREE-PHASE ELECTRICAL POWER AND METHOD THE SAME

CROSS REFERENCE TO RELATED APPLICATIONS

Reference is made to PCT/EP2016/075790 filed Oct. 26, 2016, and French Application No. 15/61.213 filed Nov. 23, 2015, which are incorporated herein by reference in their entirety.

BACKGROUND OF THE INVENTION

Field of the Invention

The present invention relates to the field of converters for converting electrical energy, notably for one of high-speed and variable speed electric machines.

A solid-state converter is a system that converts one electrical signal into another electrical signal having different characteristics. For example, a converter can convert an alternating voltage into another alternating voltage with one of a different frequency and amplitude. This is termed an alternating/alternating or AC/AC converter. According to another example, a converter can convert an alternating voltage into a direct voltage. This is termed an alternating/direct or AC/DC converter. For the reverse direct/alternating conversion, the term DC/AC converter applies. According to the final example, a converter can convert a direct voltage of one magnitude to another voltage, which is then called DC/DC converter. These converters can be reversible or non-reversible. Generally, the conversion is implemented by means of controlled switches.

To drive electrical machines, notably electrical machines with permanent magnets, from electrical energy storage system(s) (for example a battery), it is necessary to convert the direct electrical energy into three-phase alternating energy. This conversion can be done by a DC/AC converter. Such a converter must provide three sinusoidal voltages phase-shifted by 120° electrically relative to one another, the amplitude of which depends directly on the torque demand (but also on the speed of rotation), and the frequency of which depends solely on the speed of rotation of the electrical machine linked to the converter.

Conventionally, a DC/AC converter comprises three switching arms. Each switching arm comprises two controlled switches and two diodes placed in parallel to the controlled switches. Depending on the load current demand, an arm may have several "sub-arms" in parallel. The phases of the electrical machine are linked to the mid-point of each arm. Each arm is controlled separately by driving the opening and the closing of the switches over chopping periods, to form a three-phase signal.

FIG. 1 illustrates such a conventional DC/AC converter. The direct voltage from the electrical energy storage is indicated Udc. The three-phase motor M is represented schematically by three coils, powered by the currents Ia, Ib and Ic. The converter comprises three switching arms A, B, and C, linked to a phase of the electrical machine M. Each switching arm comprises two switches 1 and two diodes 2. The switching arms A, B, C are arranged in parallel, between the two direct input phases of the voltage converter Udc. The output phases of the switching arms A, B, C are linked to the mid-point (between the two switches) of the switching arms.

FIG. 2 represents the control signal COM for the switches with a constant duty cycle of 50%, the voltage Udc and the current Ic at the terminals of a switch, for a conventional DC/AC converter (as described above with reference to FIG. 1). For the control signal COM, the low part of the pulse corresponds to the switch being open, and the high part of the pulse corresponds to the switch being closed. This switching case is called hard or «on/off» switching. Note that, for this design of the converter, overshoots of the voltage Udc and of the current Io occur. The current Io corresponds to the permanent value of Ic, and corresponds to the current sent to the electrical machine.

Thus, the main drawbacks with this conventional converter design are as follows:

switching losses: This design exhibits significant switching losses, which tends to make its use incompatible with high switching frequencies and therefore for electrical machines used at very high speeds;

current/voltage overshoot: as shown in FIG. 2, this strategy exhibits voltage and current overshoots upon the instantaneous switching of the switch. Thus, this type of driving requires a margin to be taken on the voltage and the current of the different components in the design of the converter (also called inverter). This involves an overdimensioning of the components used, (for example: for a DC bus voltage of 300 volts, an IGBT switch with a nominal voltage of 600 volts is used); and significant electromagnetic emissions (EMC).

By starting from the drawbacks of the "hard switching" strategy (losses, incompatibility with high speed motors), a so-called soft switching design has been developed. Thus, to limit the overshoots of the current and of the voltage on the switches, a coil and a capacitor are added to the preceding circuit. The coil modulates the variation of the current di/dt (turn on), and the capacitor modulates the variation of the voltage dv/dt (turn-off). Furthermore, and in order to ensure the operation of the circuit, and therefore a zero energy balance, a resistor is added in the circuit between the voltage of the energy source used and the capacitive circuit. This resistor makes it possible to ensure the operation of this circuit and to lower the voltage back at the terminal of the capacitive circuit. Such a DC/AC converter design is described notably in the patent application WO 11016854.

FIG. 3 represents a simplified diagram of a switching arm (with two switches 1) with a capacitor Cs, a coil Ls, a resistor R and a capacitor Cov for soft switching. This circuit is known as "Undeland Snubber". The voltage Udc corresponds to the voltage at the terminals of the direct electrical energy storage. The coil Ls is placed between a direct input phase Udc and the switching arm A. A branch starts from the junction between the coil Ls and the switching arm A. This branch comprises two diodes D, and arrives at a junction between the resistor R and the capacitor Cov. The other end of the resistor R is connected to the direct input phase of the converter. The other end of the capacitor Cs is connected to the alternating output phase of the switching arm A. The other end of the capacitor Cov is connected to the ground. The capacitor Cs makes it possible to modulate the changing of the voltage at the terminals of the switch. This capacitor stores a part of the energy due to the soft switching of the switches. The other part of this energy is stored in a higher value capacitor Cov. Next, the energy stored in the capacitor is returned to the storage system used (battery) through the resistor. The coil Ls makes it possible to modulate the changing of the current at the terminals of the switch. In fact, the energy created by the coil Ls is not entirely stored in the capacitor Cs, hence the need for a second capacitor Cov of higher value than Cs. The resistor ensures the operation of the system and makes it possible to lower the voltage Vrec back.

FIG. 4 presents, in a manner similar to FIG. 2, the switching signal COM, the changing of the voltage Udc and the current Ic of the switch upon a so-called "soft" switching. For the control signal COM, the low part of the pulse corresponds to the switch being open, and the high part of the pulse corresponds to the switch being closed. In this figure, it will be noted that the voltage Udc and current Ic overshoots are reduced compared to the so-called "hard" switching.

The advantages of soft switching are:
lower switching losses and compatibility with high switching frequencies. Thus, this design can be used to drive electrical machines at high speeds;
little voltage and current overshoot on the switch which therefore no longer needs overdimensioning of the components; and
the changing of the voltage and of the current at the terminals of the switches upon the transition is modulated by the choice of Ls and Cs respectively.

This design of the converter requires a particular arrangement of the different electrical components, which makes the mounting thereof long and complex. Moreover, this design of the converter presents a major drawback, which is the need to dissipate energy in the resistor, the objective of which is to make the energy balance of the passive elements zero and therefore lower the voltage Vrec back, which means energy losses, and consequently reduced converter efficiency.

SUMMARY OF THE INVENTION

To mitigate these drawbacks, the present invention is a system which converts direct electrical power into alternating electrical power. The conversion system comprises an assembly on a printed circuit board of several power modules, an electrical energy recovery module and a coil. Thus, the assembly of different modules on a printed circuit board allows for a simple and rapid mounting of the conversion system. Furthermore, the power module according to the invention is suitable for soft switching, through the presence of the coil, which makes it possible to minimize the switching losses, and to limit the voltage and current overshoots. Furthermore, the electrical energy recovery module reduces the energy losses.

The invention is a system for converting a direct electrical power into three-phase alternating electrical power comprising three switching arms. The conversion system comprises an assembly on a printed circuit board of at least one power module per switching arm, an electrical energy recovery module and a coil for soft switching.

Advantageously, the assembly is arranged in a housing.

According to one implementation of the invention, the power modules comprise two switches, two diodes and two capacitors.

According to one design of the invention, the electrical energy recovery module comprises three branches linked at a junction point, with:
a first branch comprising a switch,
a second branch comprising a diode,
a third branch comprising an inductor, and
a capacitor.

According to a variant embodiment, each switching arm comprises a plurality of associated power modules, preferably between two and four modules.

Advantageously, the power modules, the coil and the electrical energy recovery module are mounted on one side of the printed circuit board, and capacitors are installed on the other side of the printed circuit board.

According to one embodiment of the invention, the conversion system comprises a cooling system, preferably a liquid cooling circuit.

Preferably, the cooling system is placed between the printed circuit board and the power and electrical energy recovery modules.

According to one implementation of the invention, the conversion system comprises a circuit for measuring at least one of voltages and currents.

According to one feature of the invention, the coil comprises multiple copper layers obtained by chemical etching, and insulated by an insulating coating.

Furthermore, the conversion system can comprise a control board.

According to one design, the conversion system comprises a power supply board.

According to one embodiment of the invention, the printed circuit board is a high-density copper multilayer board.

Furthermore, the invention relates to a method for mounting a conversion system according to one of the preceding features. For this method, the following steps are performed:
a) at least one power module per switching arm and one electrical energy recovery module are positioned;
b) the power modules are assembled on a printed circuit board;
c) the electrical energy recovery module is assembled on the printed circuit board; and
d) a coil is assembled on the printed circuit board.

Advantageously, the power and electrical energy recovery modules are positioned in a housing.

Preferably, the power and electrical energy recovery modules and the coil are assembled with the printed circuit board by soldering at least one of screw-fastening and snap-fitting.

According to a variant embodiment, the method comprises a step of assembly of capacitors on a side of the printed circuit board opposite the side of the printed circuit board on which the power modules and the recovery module are assembled.

According to one design of the invention, the method comprises a step of assembly of a cooling system between the printed circuit board and the power and electrical energy recovery modules.

According to a feature of the invention, the method comprises at least one step for the installation of a measurement circuit and at least one of a control board and a power supply board.

The invention also relates to a motor system comprising at least one electrical energy storage and one three-phase electrical machine. The motor system comprises a conversion system according to one of the preceding features, for converting the direct electrical energy from the electrical energy storage into three-phase alternating electrical energy for the electrical machine.

BRIEF DESCRIPTION OF THE DRAWINGS

Other features and advantages of the system according to the invention will become apparent on reading the following description of nonlimiting exemplary embodiments, with reference to the figures attached and described hereinbelow.

FIG. 3, already described, illustrates a DC/AC converter according to the prior art, with soft switching.

FIG. 4, already described, illustrates the switching signal, the voltage and the current in a phase for a DC/AC converter according to the design of FIG. 3.

FIG. 5a illustrates an exemplary embodiment of the electrical energy recovery module for a converter according to an embodiment of the invention.

FIG. 5b illustrates a resistive equivalent model of the electrical energy recovery module of FIG. 5a.

DETAILED DESCRIPTION OF THE INVENTION

Figure 1:
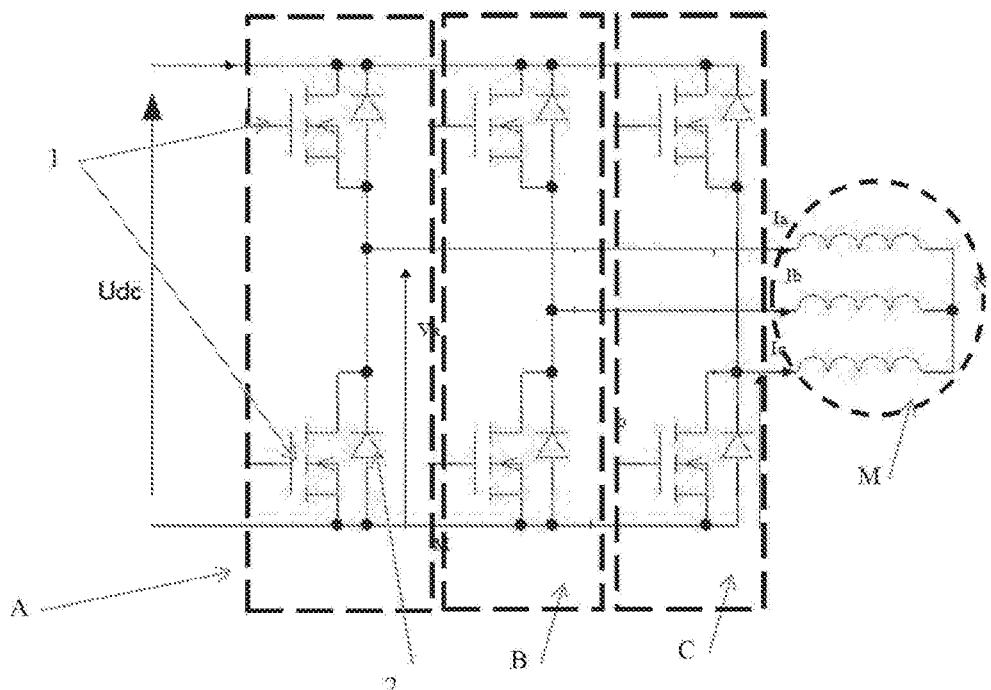
FIG. 1, already described, illustrates a conventional DC/AC converter, with hard switching, according to the prior art.
Figure 2:
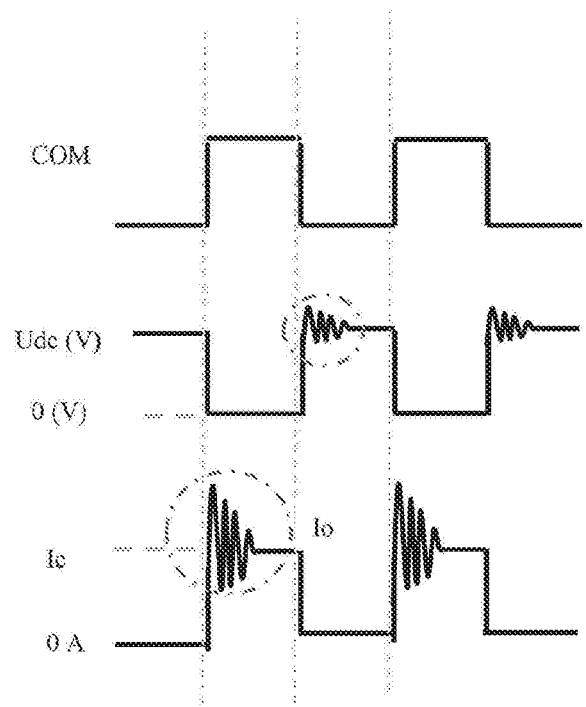
FIG. 2, already described, illustrates the switching signal, the voltage and the current in a phase for a DC/AC converter according to the design of FIG. 1.

The present invention relates to a DC/AC conversion system (converter) that converts a direct electrical energy into three-phase alternating electrical energy. Advantageously, the conversion system according to the invention can be two-way (reversible). Thus, the conversion system according to the invention, converts three-phase alternating energy into direct electrical energy.

Conventionally, the conversion system according to the invention comprises three switching arms, a direct input phase, and three alternating output phases. Each converter arm can comprise two controlled switches and two diodes. As is known, the control of the switches makes it possible to generate an alternating voltage. The alternating output phases of the conversion system are linked to the mid-point of each switching arm, that is to say between the two switches.

According to the invention, the conversion system comprises an assembly on a printed circuit board, (PCB) of:
at least one power module per switching arm, the power module comprises at least two switches to produce the conversion of direct power into alternating power;
at least one coil, which ensures the modulation of the current variation for the soft switching; and
an electrical energy recovery module, which recovers the energy available or created upon the so-called soft switching, by recovery the energy available upon the soft switching, and by sending the recovered energy to an electrical energy storage (for example a battery), connected to the direct phases of the conversion system.

The printed circuit board makes possible electrically linking the different modules (power and electrical energy recovery), as well as the coil, without the use of electrical wires. The printed circuit board is, preferably, substantially planar and can be of substantially rectangular form. The printed circuit board can be of high density copper multilayer board type, to optimize its design. In this case, the current lines are included in at least one internal layer of the printed circuit board. This type of multilayer board is suited to high currents. The printed circuit board can comprise connectors for connecting the direct inputs and the alternating outputs of the conversion system. Furthermore, the printed circuit board can comprise fixing assembly to fix the modules and the coil. The fixing can be by use of orifices, and at least one of slits and protuberances.

The term module is used to describe an independent element in block form, which groups together all the electronic components which ensure a function. Thus, each power module is a block which comprises switches for a switching arm, and the electrical energy recovery module is a block which comprises electronics for recovery electrical energy. This embodiment in module form simplifies assembly and modularity of the conversion system. In effect, the blocks can be manufactured separately, and in a standard manner, and the conversion system is made up of different modules (blocks) assembled on a printed circuit board. Thus, it is not necessary to assemble all the electronic components of the conversion system on a single element. Furthermore, this embodiment in module form simplifies maintenance by making possible replacing just a defective module without having to replace the converter as a whole. Another advantage of this design is the possibility of using standard modules, which can be chosen according to the desired application.

According to one embodiment, the different modules (power or electrical energy recovery), and the coil are assembled on the printed circuit board by soldering, at least one of screw-fastening, snap-fitting (clipping) or anything similar. These assembly techniques permit rapid assembly.

The different embodiments, notably the make-up of the different modules, described in the description can be combined.

Each power module serves as a switching arm for the conversion system. The power module can comprise:
two inputs, that can be connected to the DC inputs of the conversion system with the first input being linked to a positive voltage and the second input being linked to the ground;
two switches mounted in series between the two inputs which switches can be controlled, to provide an alternating output current;
one output, that can be connected to an alternating output phase of the conversion system with the output being connected at a point between the two switches,
two diodes passing current in one direction; and
two capacitors with a first capacitor which is a voltage modulation capacitor (which allows the modulation of the voltage variation for the soft switching) and a second capacitor (which makes possible storage of the energy which is not stored in the first capacitor in the modulation of the voltage).

Such a power module is compatible with a wide operating voltage range.

According to one embodiment of the invention, the power module contains only these electronic components which are two switches, two diodes, and two capacitors. For this embodiment, only the second capacitor can be formed by a parallel association of several capacitors (for example two or three capacitors).

Furthermore, the power module is suited to a conversion system which comprises an electrical energy recovery module 5'. The power module can comprise a second output that can be connected to the electrical energy recovery module. This second output can be connected to a diode.

According to one embodiment of the invention, the diodes of the power module are mounted in series. The diodes can be connected to a first input of the power module. For example, the input linked to the positive voltage. In the case where the power module comprises a second output for an electrical energy storage module, the diodes are connected to this second output.

Furthermore, the voltage modulation capacitor can be mounted between a point lying between the two diodes and the first output.

Furthermore, the second capacitor can be mounted between the second output and the second input of the power module, on the input of the power module, on which the diodes are not mounted. For example this second input can correspond to the ground.

According to a feature of the invention, the switches of the power modules can be switches of at least one of a MOSFET (Metal Oxide Semiconductor Field Effect Transistor) and an IGBT (Insulated Gate Bipolar Transistor), according to the DC bus input voltage. For the high voltage, IGBT switches can be used. For the low voltage, MOSFET switches can be used.

Preferably, the switches can be controlled by a pulse width modulation (PWM) method. The general principle of this modulation method is that, by applying a succession of discrete states for well chosen durations, it is possible to obtain, on average over a certain period, of any intermediate value.

For the modulation of the variations of the voltage, the first voltage modulation capacitor can have a value of between 4 and 15 nF, preferably between 4 and 10 nF.

The second capacitor preferably has a higher capacitance than the first capacitor. The second capacitor can have a value of between 500 and 5000 nF, preferably between 600 and 2,500 nF. According to a variant embodiment of the invention, the second capacitor can be formed by capacitors associated connected in at least one of a parallel and series. Advantageously, to limit the bulk, the second capacitor can be formed by three identical capacitors (of the same capacitance) associated in parallel.

Advantageously, the power module is a block, which facilitates the assembly, compactness and standardization thereof. The block can comprise a support, a plate comprising a printed circuit, and the electronic components (switches, diodes, capacitors) of the power module. The plate can be a printed circuit. The electronic components are mounted on the plate. The plate is mounted on the support. The block can be arranged to be mounted on the printed circuit board of a conversion system. The block can have a substantially parallelepipedal form.

According to a variant embodiment of the invention, the block can comprise several fixing mechanisms of components onto a board of a conversion system. The fixing mechanism can notably be at least one notch provided for the passage of a screw. The notch can be provided in the at least one support and the plate of the block. The notch can be substantially oblong. The fixing mechanism can comprise at least one of a slit protrusion, allowing a fixing by snap-fitting (clipping) or to allow positioning of the block.

The block can also comprise fixing mechanisms for fixing several modules together, to associate several modules together, notably for the case where the currents are high, which makes it possible to produce the switching arm of a conversion system without employing components that have high specific characteristics and that are expensive.

Figure 6:
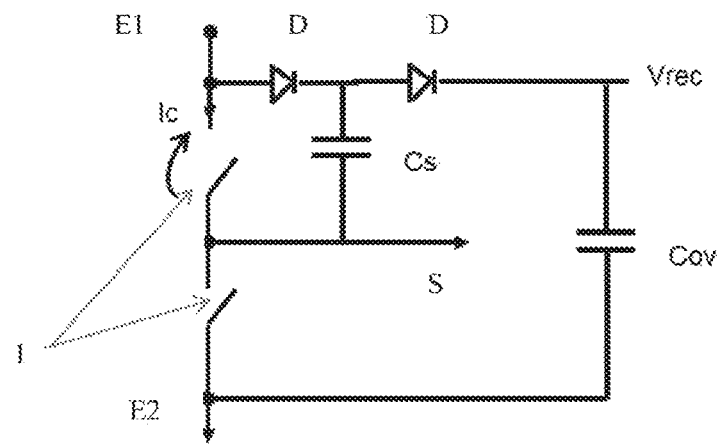
FIG. 6 illustrates an electrical circuit diagram of a power module according to an embodiment of the invention.

FIG. 6 illustrates, in a nonlimiting manner, an electrical circuit diagram of a power module according to an embodiment of the invention. The power module comprises two inputs E1 and E2 for connection to the direct inputs of the conversion system. The input E1 can correspond to the positive voltage input, and the input E2 can correspond to the ground. Between the two inputs E1 and E2, two controlled switches 1 are mounted in series. Between the two switches 1, the output S is connected, which is for connection to an output phase of the conversion system. Two diodes D are mounted in series between the input E1 and the second output Vrec which can be connected to an electrical energy recovery module. A first capacitor Cs, which provides the voltage modulation, is connected at a point between the two diodes D and the first output S. A second capacitor Cov is connected between the second output Vrec and the second input E2.

Figure 7:
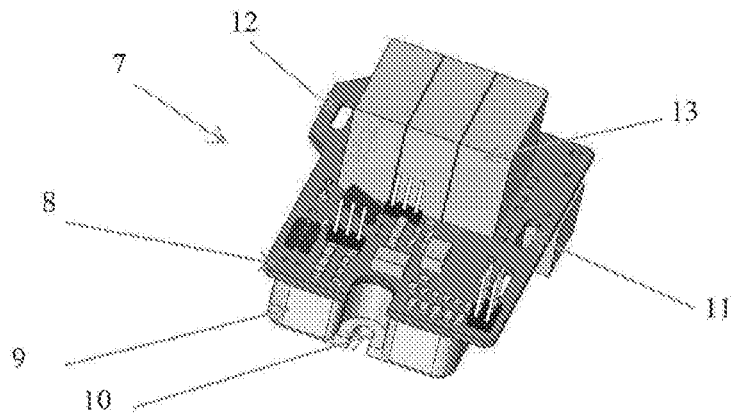
FIG. 7 illustrates the design of a power module according to an embodiment of the invention.

FIG. 7 illustrates, schematically and in a nonlimiting manner, a power module according to an embodiment of the invention. The module is substantially in the form of a block 7. The block 7 comprises a plate 8, having a printed circuit on which electronic components are mounted. The plate is substantially rectangular. The plate 8 is mounted on a support 9. The support 9 has a substantially rectangular parallelepipedal shape. The plate 8 and the support 9 comprise several attaching mechanisms: a notch 10 provided for the passage of a screw, at least one of two slits 11 and 12 for fixing by snap-fitting and for a positioning of the block. Electronic components (represented schematically) are mounted on the plate 8 on the side opposite the support 9. Among the electronic components, the second capacitor Cov is formed by three capacitors 13 associated in parallel.

According to the invention, the conversion system further comprises a voltage and current modulation circuit. The voltage and current modulation circuit includes soft switching making possible limiting of the switching losses, to limit the voltage and current overshoots on the switches. The modulation circuit comprises a coil, which modulates the current variation, and a capacitor for each phase, to modulate the voltage variation. The coil is mounted directly on the printed circuit board. In order to maximize the copper density in the winding of the coil, the winding can be formed by layers of copper obtained by chemical etching and insulated by the application of an insulating coating, to minimize the skin effect which could have a detrimental effect for high frequencies. Each capacitor providing modulation is included in one of the power modules.

According to an embodiment of the invention, the modulation circuit comprises a coil which links a direct input phase of the switching system and the switching arms.

According to the invention, the conversion system further comprises an electrical energy recovery module. Advantageously, the electrical energy recovery module does not comprise any resistors. Thus, the conversion system does not include any resistors, in which energy is dissipated as in the prior art. On the contrary, the electrical energy recovery module, which replaces the prior art resistor, makes possible recovery of the energy available or created by soft switching, by recovery of the energy available during the soft switching and by sending the recovered electrical energy to an electrical energy storage (for example a battery), connected to the direct phases of the conversion system. The function of the electrical energy storage module discharges the protection circuits of the switches and provides this energy to the DC bus. Thus, the electrical losses are greatly reduced. The electrical energy recovery module is linked to the switching arm and to the modulation circuit.

According to a possible design of the invention, the electrical energy recovery module can comprise at least one inductor, at least one diode, at least one capacitor and at least one switch. The switch is controlled to recover the energy and thereof to transfer of the electrical energy to the electrical energy storage. Advantageously, the recovery circuit can be produced with a buck topology.

According to a variant embodiment of the invention, the electrical energy recovery module can comprise three branches linked at a junction point with:
 a first branch comprising a switch,
 a second branch comprising a diode, and
 a third branch comprising an inductor.

Thus, the printed circuit board of the conversion system can be modified specifically to provide a soft switching converter compatible with high switching frequencies, while minimizing losses due to the passive circuit added to ensure the operation of the modulation circuit.

The electrical energy recovery module can be a mechanism for attaching the module to the printed circuit board. The fixing can be done by soldering, screw-fastening, snap-fitting or any similar mechanism. To this end, the fixing to the printed circuit board can include at least one orifice, for example for the passage of a screw, at least one protuberance, at least one slit, etc.

FIG. 5a represents, schematically and in a nonlimiting manner, such an electrical energy recovery module 5'. The electrical energy recovery module 5' comprises three branches linked at a junction point P, with:
 a first branch with a switch 6,
 a second branch comprising a diode 4 (in which a current iL circulates dependent on the voltage at its terminals), and
 a third branch comprising an inductor Lrec.

In FIG. 5a, the capacitor 5 represents the capacitance of the electrical energy storage (battery) and is not a component of the recovery module. The capacitor 5 is placed between the inductor Lrec and the ground.

Furthermore, the capacitor 3 represents the capacitance Crec, and it is a component of the recovery module. The capacitor 3 is placed between the switch and the ground.

The diode 4 is placed between the junction point of the three branches and the ground.

By driving the switch (its duty cycle), it is possible to drive the current iL which circulates between Vrec and Udc (the current sent to the battery).

Thus, by considering the assembly formed by the recovery module and the capacitor of the electrical energy storage, the assembly is formed by three parallel branches, placed between the point P and the ground, with:
 a first branch comprising the switch 6 and the capacitor 3,
 a second branch comprising a diode 4, and
 a third branch comprising the inductor Lrec and the capacitance 5 of the electrical energy storage.

When the switch is closed, the diode is in a blocked mode and the current iL, which circulates in the coil Lrec (represented in FIG. 5a), is equal to $$\frac{V_{rec} - U_{dc}}{L_{rec}}.$$

When the switch is open, the diode is in a conducting mode and the current iL which circulates in the coil Lrec (represented in FIG. 5a) is equal to $$\frac{-U_{dc}}{L_{rec}}.$$

Thus, by driving the opening and closing time of the switch, it is possible to control the mean value of the current iL, and have operation equivalent to a resistive circuit.

FIG. 5b represents, in a nonlimiting manner, an equivalent electrical circuit diagram of the electrical energy recovery module illustrated in FIG. 5a. Thus, the electrical energy recovery module is equivalent to an equivalent resistance Req, in which a current iL circulates, but without dissipation of the electrical energy.

For this variant embodiment, the mean current in this circuit can be expressed in the following form:

$$\bar{i} \cong \frac{V_{rec} - U_{dc}}{L_{rec}} \frac{T}{2} = \frac{V_{rec} - U_{dc}}{2 * L_{rec} * Fsw} \cong \frac{V_{rec} - U_{dc}}{Req}$$

with:
T being the switching period of the switch,
Vrec being the recovery voltage,
Udc being the direct input phase voltage,
Lrec being the inductance of the recovery module,
Req being the equivalent resistance,
Fsw being represents the switching frequency of the switches.

Preferably, such an energy recovery module is mounted in the conversion system equipped with the modulation circuit, such that the electrical energy recovery module is arranged between a direct input phase of the conversion system and the junction between the switching arm and the capacitor of the modulation circuit. For the embodiment of FIG. 5a, the electrical energy recovery module can be connected such that:
 the point of the recovery module linked to the direct input phase (of voltage Udc) of the conversion system corresponds to the point of the third branch of the energy recovery module between the inductor Lrec and the second capacitor 5 (this capacitor is the capacitance of the battery); and
 the point of the energy recovery module linked to the junction between the switching arm (of voltage Vrec) and the capacitor of the modulation circuit corresponds to the point of the first branch of the energy recovery module between the switch 6 and the first capacitor 3.

In an implementation of the invention, the conversion system can comprise a housing, in which the assembly is mounted. The housing can comprise several orifices: notably two for the direct inputs, to allow the connection with the electrical energy storage system, and three for the alternating outputs, to allow connection with the phases of the electrical machine. Advantageously, the housing can have a substantially parallelepipedal shape. Furthermore, the housing can comprise means for positioning of the different modules prior to their assembly on the printed circuit board. The housing can also comprise locations for the different circuits and boards that can form part of the conversion system.

Figure 10:
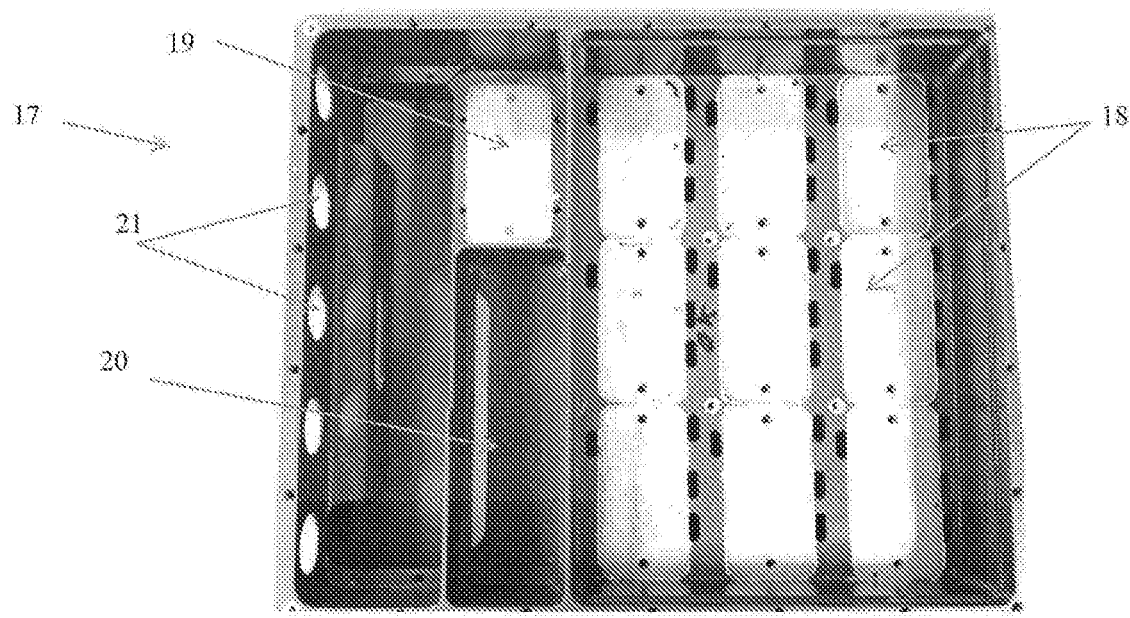
FIG. 10 illustrates a housing for the energy conversion system according to an embodiment of the invention.

FIG. 10 illustrates, in a nonlimiting manner, a housing, without its cover, for a conversion system according to an embodiment of the invention. The housing 17 has a parallelepipedal shape. The housing 17 comprises locations for receiving the power modules. According to the example illustrated, the housing 17 comprises nine locations 18 for nine power modules (three for each switching arm). The housing 17 comprises a location 19 for receiving an electrical energy recovering module. The housing 17 also comprises a location 20 for the coil of the soft switching circuit. Furthermore, the housing 17 comprises five orifices 21 for mounting of connecting the two direct inputs and the three alternating outputs. In FIG. 10, holes and slits are represented, which are used for the assembly of the modules relative to the printed circuit board, and those on the edge are used for fixing the cover of the housing.

According to a design of the converter according to the invention, the printed circuit board can also comprise capacitors called bus capacitors. These bus capacitors make it possible to decouple the inductance of the cable and the inductance of the coil of the modulation circuit. To optimize the surface area of the printed circuit board, the bus capacitors are mounted on the printed circuit board on the side opposite the various modules The modules are mounted on one side of the board and the bus capacitors are mounted on the other side.

Figure 8:
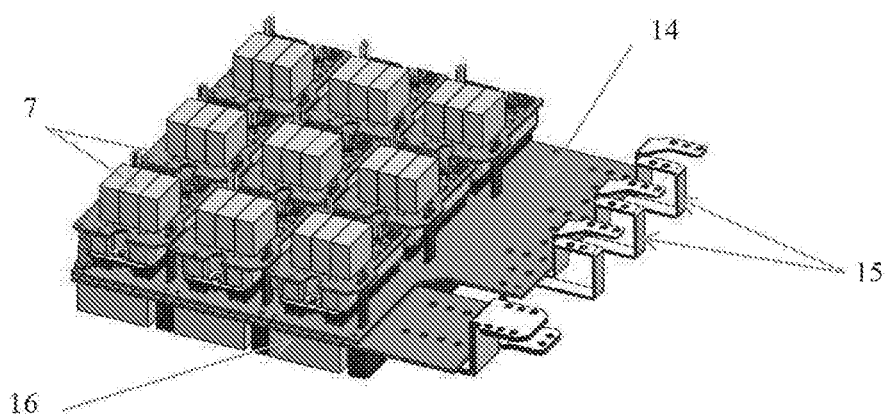
FIG. 8 illustrates, by a first view, the printed circuit board equipped with the power modules according to an embodiment of the invention.
Figure 9:
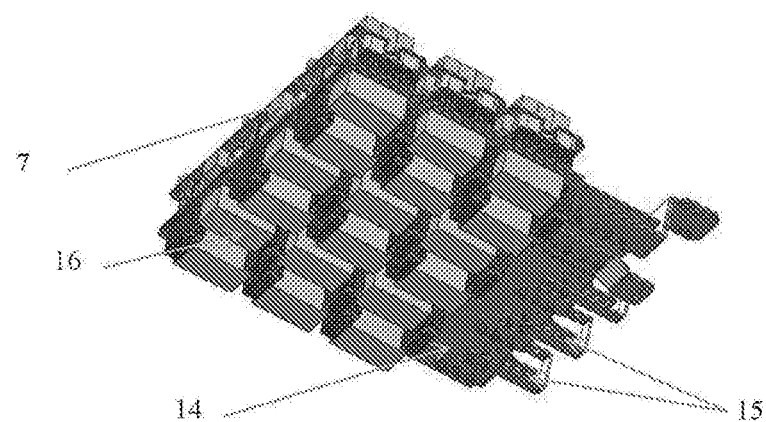
FIG. 9 illustrates, by a second view, the printed circuit board equipped with the power modules according to an embodiment of the invention.

FIGS. 8 and 9 illustrate, in a nonlimiting manner, from two distinct angles, a printed circuit board 14, on which are assembled power modules 7 (here nine power modules) and bus capacitors 16. According to the view of FIG. 8, the bus capacitors 16 are assembled on the underside of the printed circuit board 14 whereas the power modules 7 are assembled on top of the printed circuit board 14. The printed circuit board comprises five plugs 15 for connecting the direct inputs to the alternating outputs. In these figures, the electrical energy recovery module and the coil are not represented.

According to an embodiment of the invention, the conversion system comprises a cooling system. Thus, it is possible to avoid overheating of the electronic components. Preferably, the cooling system is a liquid cooling system, which comprises a circuit in which liquid circulates. However, the cooling system can be an air ventilation or air circulation cooling system. The circuit in which the liquid circulates can have a serpentine form, to optimize the cooled surface area. The liquid circuit can be placed between the board and the power and electrical energy recovery modules, to simultaneously cool the printed circuit board and the various modules.

According to an embodiment of the invention, the conversion system comprises a control board. According to one example, the control board can be based on a DSP from Texas Instruments, and can execute the following functions:
  conditioning of analog reads,
  management of inputs and outputs,
  management of protection provisions, for example using means making it possible to disconnect the conversion system in case of an overvoltage or overcurrent, and
  management of pulse width modulation (PWM) for the switches of the switching arms.

According to an implementation of the invention, the conversion system can comprise a measurement circuit. The measurement circuit can be formed by a board possibly comprising several sub-boards. The measurement circuit makes it possible to measure the quantities necessary to control, in particular at least one of the phase voltages, and currents, and the bus voltage and current, and the voltage of the electrical energy recovery module.

Furthermore, the conversion system according to the invention can comprise a power supply board, which can generate a high-frequency square wave (for example 18 V at 130 kHz), which can be used for each board (for example, the control board, the sub-boards of the measurement circuit) to create voltage levels.

The conversion system according to the invention makes it possible to drive electrical machines, for all kinds of applications, in particular for electrical machines rotating at very high speeds with a high inverter (converter) efficiency.

The converter according to the invention can be provided for an embedded use, in particular in a vehicle, notably land, aeronautical or naval.

The conversion system according to the invention can also be used in non-embedded electrical energy production systems, such as turbines, micro-turbines or wind turbines.

Furthermore, the present invention relates to a motor system comprising at least one electrical energy storage, for example a battery, and one three-phase electrical machine, for example a permanent magnet electric machine. The motor system comprises a conversion system according to one of the embodiments described above, to convert direct electrical energy from the electrical energy storage into three-phase alternating electrical energy for the electrical machine, and possibly vice versa. Thus, by virtue of the conversion system, the electrical machine can be driven, while limiting the electrical losses. Furthermore, if the conversion system is two-way (reversible), then it is also possible to store (for example in a battery) electrical energy generated by the rotation of the electrical machine.

Furthermore, the present invention relates to a method for assembling a conversion system according to one of the embodiments described previously. The assembly method comprises the following steps:
  a) at least one power module per switching arm and one electrical energy recovery module are positioned, notably in a housing;
  b) a printed circuit board is positioned relative to the various modules, and the power modules are assembled on the printed circuit board, for example by soldering, screw-fastening, snap-fitting or any similar mechanism;
  c) the electrical energy recovery module is positioned on the printed circuit board, for example by soldering, screw-fastening, snap-fitting, or any similar mechanism; and
  d) a coil is assembled on the printed circuit board, for example by soldering, screw-fastening, snap-fitting, or any similar mechanism.

The steps b), c) and d) can be performed in any order or simultaneously.

Furthermore, the method can comprise a step of assembling bus capacitors on the printed circuit board, on the opposite side of the board, on which the various modules are assembled.

Furthermore, the method can comprise a step of placement and assembling of a cooling system. Preferably, the cooling system, in particular in the form of a liquid circulation circuit, can be placed between the printed circuit board and the various modules.

Moreover, the method can comprise at least one step for the installation of at least one of the following elements: a measurement circuit, a control board, a power supply board.

Comparative Example

A comparative example has been provided, which compares the losses of the conversion system according to the invention with the losses of the DC/AC conversion systems according to the prior art. The system according to the invention tested corresponds to the circuit according to the embodiment of FIG. 5, with an assembly according to the embodiments of FIGS. 8 and 9. The DC/AC conversion systems of the prior art correspond respectively to the hard switching and to the soft switching, respectively, according to the embodiments of FIGS. 1 and 3.

For this example, the values used for an inverter with a rated power of 50 kW, are as follows:
Ls~=300 microH,
Cs~=6.8 nanoF,
Cov~=1410 nanoF,
Vrec~=1.5 Vbus,
Lrec=56 microH,
Crec=20 nanoF,
switch type: IGBT.

TABLE 1

Comparative example

| | Power supplied | Total losses | Losses by dissipation in the added circuit | Switching losses | Switching frequency |
|---|---|---|---|---|---|
| Prior art hard switching (FIG. 1) | 50 kW | 2 kW | 0 kW | 2 kW | 20 khz |
| Prior art soft switching (FIG. 3) | 50 kW | 2 kW | 1 kW | 1 kW | 50 khz |
| Invention (FIG. 5) | 50 kW | 1.15 kW | 0.15 kW | 1 kW | 50 khz |

It will be noted that the conversion system makes it possible to reduce the total losses by approximately 42.5% compared to the conversion systems according to the prior art. This reduction is due to a reduction of the switching losses linked to the soft switching (switching losses reduced by 50% relative to hard switching), and by a reduction of the losses by dissipation in the added circuit (dissipation losses reduced by 85% relative to soft switching).

The invention claimed is:

1. A system for converting a direct electrical power into three phase alternating electrical power comprising:
three switching arms, including an assembly on a printed circuit board of at least one power module per switching arm, an electrical energy recovery module for recovering of electrical energy available upon soft switching which is transmitted from the electrical energy recovery module to an electrical energy storage and a coil controlling current flowing to an electrical storage from the electrical energy recovery module for soft switching, wherein each switching arm comprises associated power modules, the power modules comprising a first capacitor for each alternating output phase of the system and a second capacitor placed between the electrical energy recovery module and a ground, and wherein the electrical energy recovery module comprises three branches linked at a junction point, with a first branch comprising a switch and a third capacitor placed between the switch and the ground, a second branch comprising a diode, and a third branch comprising an inductor.

2. The system according to claim 1, wherein the assembly is contained in a housing.

3. The system according to claim 1, wherein the at least one power module comprises two switches, two diodes and two capacitors.

4. The system according to claim 1, wherein the third branch comprising an comprises the inductor and a capacitor.

5. The system according to claim 1, wherein the at least one power module, the coil and the electrical energy recovery module are mounted on one side of the printed circuit board, and capacitors are installed on another side of the printed circuit board.

6. A method for mounting a conversion system according to claim 1, comprising:
a) positioning at least one power module per switching arm and one electrical energy recovery module on the printed circuit board;
b) assembling the at least one power module on the printed circuit board;
c) assembling the electrical energy recovery module on the printed circuit board; and
d) assembling a coil on the printed circuit board.

7. A motor system comprising at least one electrical energy storage and a three phase electrical machine, comprising a system according to claim 1, for converting the direct electrical energy from the electrical energy storage into three phase alternating electrical energy for the three-phase electrical machine.

8. The method according to claim 6, comprising positioning the power module and the electrical energy recovery module in a housing.

9. The method according to claim 6, comprising assembling the power module and the electrical energy recovery module and the coil with the printed circuit board by at least one of soldering, screw-fastening and snap fitting.

10. The method according to claim 6, comprising assembling capacitors on a side of the printed circuit board which is opposite to a side of the printed circuit board on which the power module and the energy recovery module are assembled.

11. The method according to claim 6, comprising assembling a cooling system between the printed circuit board and the power module and the electrical energy recovery module.

12. The method according to claim 6, comprising installing at least one of a measurement circuit, a control board, and a power supply board in the system.

* * * * *